United States Patent
Buck et al.

(10) Patent No.: US 7,797,657 B2
(45) Date of Patent: *Sep. 14, 2010

(54) PARAMETER ORDERING FOR MULTI-CORNER STATIC TIMING ANALYSIS

(75) Inventors: Nathan C. Buck, Underhill, VT (US); John P. Dubuque, Jericho, VT (US); Eric A. Foreman, Fairfax, VT (US); Peter A. Habitz, Hinesburg, VT (US); Kerim Kalafala, Rhinebeck, NY (US); Peihua Qi, Wappingers Falls, NY (US); Chandramouli Visweswariah, Croton-on-Hudson, NY (US); Xiaoyue Wang, Kanata (CA)

(73) Assignee: International Business Machines Corporation, Armonk, NY (US)

( * ) Notice: Subject to any disclaimer, the term of this patent is extended or adjusted under 35 U.S.C. 154(b) by 778 days.

This patent is subject to a terminal disclaimer.

(21) Appl. No.: 11/679,831

(22) Filed: Feb. 27, 2007

(65) Prior Publication Data

US 2008/0209374 A1    Aug. 28, 2008

(51) Int. Cl.
*G06F 17/50* (2006.01)
(52) U.S. Cl. .......................................................... 716/6
(58) Field of Classification Search .................. 716/1–6
See application file for complete search history.

(56) References Cited

U.S. PATENT DOCUMENTS

| 7,089,143 B2 | 8/2006 | Foreman et al. |
| 7,117,466 B2 | 10/2006 | Kalafala et al. |
| 2004/0044976 A1 * | 3/2004 | Schultz ........................... 716/6 |

* cited by examiner

*Primary Examiner*—Paul Dinh
(74) *Attorney, Agent, or Firm*—Downs Rachlin Martin PLLC (57) ABSTRACT

A method and system for decreasing processing time in multi-corner static timing analysis. In one embodiment, parameters are ordered in a parameter order by decreasing magnitude of impact on variability of timing. In one example, a decreasing parameter order is utilized to order slack cutoff values that are assigned across a parameter process space. In another example, a decreasing parameter order is utilized to perform a multi-corner timing analysis on one or more dependent parameters in an independent fashion.

16 Claims, 6 Drawing Sheets

PARAMETER ORDERING FOR MULTI-CORNER STATIC TIMING ANALYSIS

RELATED APPLICATION DATA

This application is related to U.S. patent application Ser. No. 11/679,834, filed Feb. 27, 2007, entitled "Variable Threshold System and Method for Multi-Corner Static Timing Analysis," which is incorporated herein by reference in its entirety.

FIELD OF THE DISCLOSURE

The present disclosure generally relates to the field of static timing analysis. In particular, the present disclosure is directed to a system and method for parameter ordering in multi-corner static timing analysis.

BACKGROUND

Static timing analysis (STA) is utilized to verify integrated circuit design and analyze circuit performance. In circuit design, one signal may need to arrive at a particular point in a circuit path at a particular time with respect to another signal. A timing test with respect to a pair of timing test points is typically to compare two signals to determine whether a particular requirement on their relative arrival time is met. The difference of the relative arrival time of two signals at the timing test point is referred to as "slack". Two paths on which signals propagate to arrive at the pair of timing test points (e.g., clock and data pins of a flip-flop circuit) are often referred to as racing paths. Timing of integrated circuits may vary due to the effects of environmental and process variation parameters. In multi-corner static timing analysis, each source of variation to be analyzed is modeled as a parameter having an impact on a delay of a circuit path and/or a circuit. Example sources of variation include, but are not limited to, voltage, metal width, temperature, transistor channel length, transistor threshold voltage, gate oxide thickness, other process controlled performance changing parameters. In one example, each of the parameters is used to model process, environmental conditions, and aging affects in static timing analysis can be toggled between its extreme distribution endpoints. Any specific setting of these parameter values is referred to as a corner. In one example, a parameter may be set to one of its extreme values (e.g., a 3SIGMA extreme value). In such an example, one parameter setting provides a fastest signal propagation checked in a timing analysis and the other corner provides a slowest signal propagation in a timing analysis as a function of this parameter. A static timing analysis may start with each parameter in a set having its values set to a particular extreme, called a starting corner.

Parameters for analysis in timing tests typically can be independent or dependent. In one example, an independent parameter allows for a given path to be evaluated at the corners of that parameter irrespective of the corner settings of other process variable/parameters. However, dependent parameters typically must be evaluated with respect to settings of other parameters. In such an analysis, testing of combinations of multiple parameter settings may occur in a multi-corner timing analysis. In such an analysis with n parameters, there may be $2^n$ extreme corner combinations that require evaluation in order to determine the worst slack across all process corners. As the number of parameters to test increases and the complexity of integrated circuit designs continues to grow, the analysis of the large number of extreme corner combinations for each path of an integrated circuit becomes difficult, if not impossible, to perform in a reasonable amount of time. Reduction of the number of paths requiring full multi-corner analysis at all $2^n$ process corners can reduce the time required to perform a full chip analysis within a reasonable runtime.

One manner to reduce the number of paths to analyze in a multi-corner analysis involves comparing a slack value obtained from a starting corner analysis to an initial threshold, often referred to as a slack cutoff. In one example, a slack cutoff threshold may be determined empirically for a given integrated circuit technology and/or set of environmental conditions (e.g., process variations) that apply to the integrated circuit by identifying an upper bound on the slack change of any path going from a starting corner to any other corner in the process space. If a starting corner slack determined for a path passes a chosen slack cutoff value, it is estimated that the path would pass all corner analyses. Thus, any path that has a starting corner slack that is above a starting corner slack cutoff can be removed from analysis as it will likely pass multi-corner analysis. This can reduce the number of paths for multi-corner analysis. However, in order to reduce the possibility of having paths that potentially have a timing failure from erroneously being removed from analysis, the slack cutoff value is often set at a fairly high value. This, in turn, may lead to an undesirably low reduction in the number of paths that require full multi-corner analysis.

SUMMARY OF THE DISCLOSURE

In one embodiment, a computerized method of decreasing processing time in multi-corner static timing analysis is provided. The method includes determining an n number of dependent parameters ($P_i$), each dependent parameter ($P_i$) having an impact on variability of timing; ensuring the n number of dependent parameters ($P_i$) are organized in a decreasing parameter order from a first parameter $P_1$ having a largest impact on variability of timing to a last parameter $P_n$ having a smallest impact on variability on timing; and performing a multi-corner timing analysis by utilizing the decreasing parameter order to output an indication of timing verification for one or more paths of an integrated circuit design.

In another embodiment, a computerized method of decreasing processing time in multi-corner static timing analysis is provided. The method includes determining an n number of dependent parameters ($P_i$), each dependent parameter ($P_i$) having an impact on variability of timing; ensuring the n number of dependent parameters ($P_i$) are organized in a decreasing parameter order from a first parameter $P_1$ having a largest impact on variability of timing to a last parameter $P_n$ having a smallest impact on variability on timing; conducting a starting corner timing analysis to determine a starting corner slack for each path of one or more predetermined paths of an integrated circuit design; varying parameter $P_1$ in the parameter order to a non-starting corner parameter value to determine a first non-starting corner slack for each path; comparing the starting corner slack for each path with a corresponding first non-starting corner slack to determine a worst slack value for each path at $P_1$; analyzing each path by varying a next parameter $P_i$ in the parameter order, starting with $P_2$, to a non-starting corner parameter value while holding any other unvaried parameter at its starting corner parameter value and holding any previously varied parameter at a corner parameter value that produced its corresponding worst slack value, the analyzing including: determining a second non-starting corner slack for each path; and comparing the second non-starting corner slack for each path with a corresponding worst slack value determined from the most recent prior comparing step to update the worst slack value for each path at $P_i$; repeating the analyzing step for each remaining parameter $P_i$ in the parameter order and determining a final worst slack value for each path from the worst slack value determined by the varying of the last parameter in the parameter order; outputting an indication of timing verification based on the final worst slack for each path of one or more paths of the integrated circuit design.

In yet another embodiment, a computer readable medium containing computer executable instructions implementing a method of decreasing processing time in multi-corner static timing analysis is provided. The instructions include a set of instructions for determining an n number of dependent parameters ($P_i$), each dependent parameter ($P_i$) having an impact on variability of timing; a set of instructions for ensuring the n number of dependent parameters ($P_i$) are organized in a decreasing parameter order from a first parameter $P_1$ having a largest impact on variability of timing to a last parameter $P_n$ having a smallest impact on variability on timing; and a set of instructions for performing a multi-corner timing analysis by utilizing the decreasing parameter order to output an indication of timing verification for one or more paths of an integrated circuit design.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Embodiments of the present disclosure include a system and method for reducing processing time in multi-corner static timing analysis. In one embodiment, a variable slack cutoff scheme is utilized for a process space of a number of parameters to be used in a multi-corner analysis. In another embodiment, the parameters of a process space are organized in decreasing order of delay sensitivity for each parameter. In one example of such an embodiment, slack cutoff values attributed to each parameter in a variable slack cutoff scheme are organized in the same order as the parameters. In yet another embodiment, a multi-corner timing analysis may be performed using a variable slack cutoff scheme to reduce the time required to process a number of paths through multi-corner timing analysis. These and other embodiments and aspects are discussed further below with respect to the examples illustrated in FIGS. 1 to 6.

Embodiments of the present disclosure include a system and method for reducing processing time in multi-corner static timing analysis. In one embodiment, a variable slack cutoff scheme is utilized for a process space of a number of parameters to be used in a multi-corner analysis. In another embodiment, the parameters of a process space are organized in decreasing order of delay sensitivity for each parameter. In one example of such an embodiment, slack cutoff values attributed to each parameter in a variable slack cutoff scheme are organized in the same order as the parameters. In yet another embodiment, a multi-corner timing analysis may be performed using a variable slack cutoff scheme to reduce the time required to process a number of paths through multi-corner timing analysis. These and other embodiments and aspects are discussed further below with respect to the examples illustrated in FIGS. 1 to 6.

Figure 1:
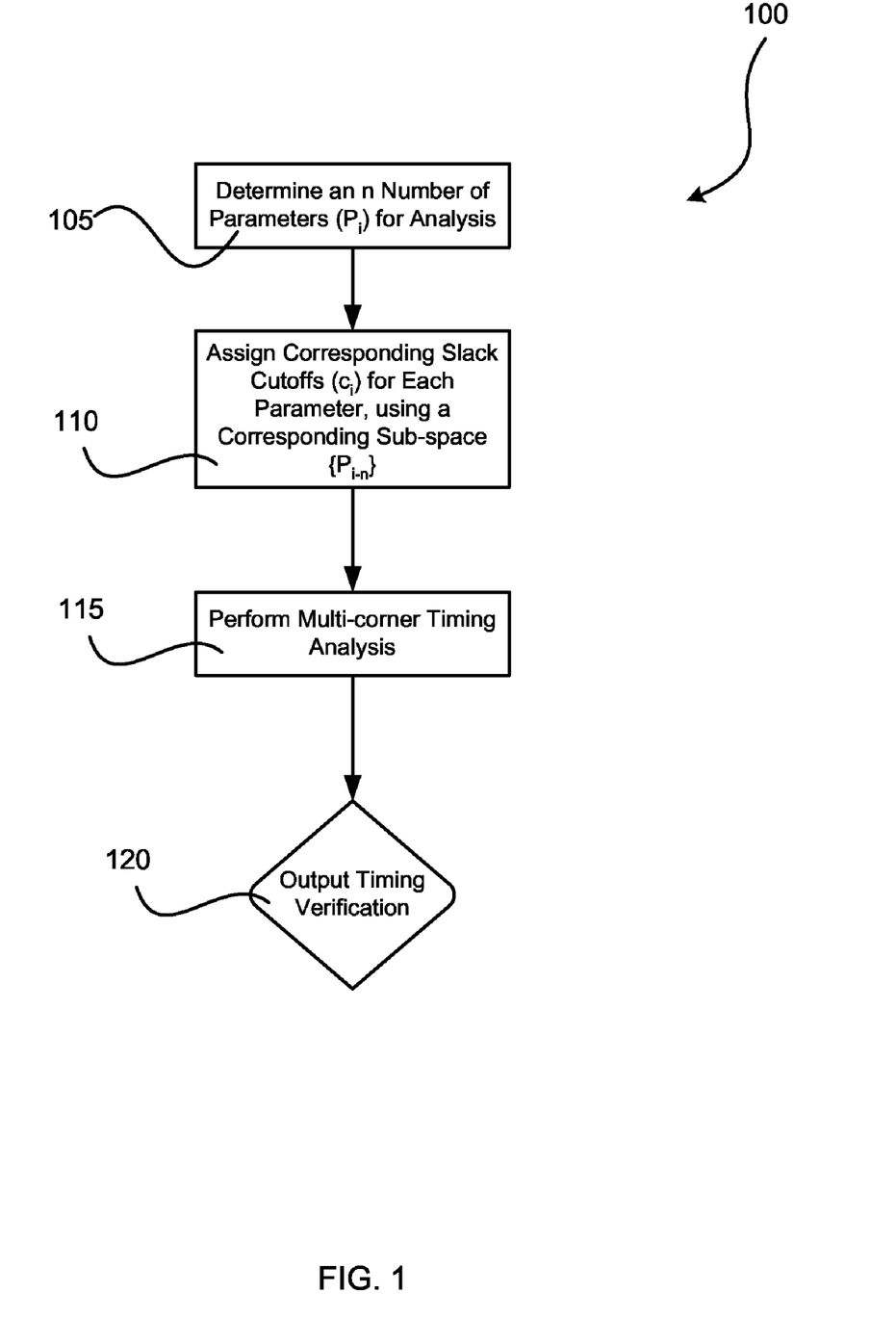
FIG. 1 illustrates one embodiment of a method for reducing processing time in multi-corner static timing analysis.

FIG. 1 illustrates one embodiment of a method 100. At step 105, parameters for use in a multi-corner timing analysis are determined. The set of parameters determined make up a process space for the analysis. In one example, n number of parameters may be determined. In such an example, for ease of description each parameter may be designated as $P_i$, where i can be a value from 1 to n. The full parameter process space for this example would include $P_1$, $P_2$, ... $P_n$, with the parameters $P_i$ thought of as being in a parameter order from $P_1$ to $P_n$. A full process space may be viewed as including any number of subdivisions (i.e., a process sub-space) of the entire process space. In one example, a process sub-space may be defined for each of the parameters Pi (e.g., one or more parameter process sub-spaces defined by $P_{i \to n}$). The concept of a full process space including one or more process sub-spaces does not require that a full process space actually be divided (e.g. physically or logically in a software implementation) into separate groups. The concept of process sub-spaces is utilized further below in determining one or more slack cutoffs for a variable slack cutoff scheme.

To illustrate parameters and process spaces further, an exemplary set of parameters for use in a timing analysis may include six (6) parameters $P_i$ such that the full process space would include $\{P_1, P_2, P_3, P_4, P_5, P_6\}$. This full process space may be viewed to include any number of process sub-spaces (e.g., the same number of process sub-spaces as the number of parameters, here six). In this example, the full process space may include six process sub-spaces defined by $P_{i \to n}$ (e.g., a process sub-space for $P_1$ including $\{P_1, P_2, P_3, P_4, P_5, P_6\}$; a process sub-space for $P_2$ including $\{P_2, P_3, P_4, P_5, P_6\}$; a process sub-space for $P_3$ including $\{P_3, P_4, P_5, P_6\}$; a process sub-space for $P_4$ including $\{P_4, P_5, P_6\}$; a process sub-space for $P_5$ including $\{P_5, P_6\}$; and a process sub-space for $P_6$ including $\{P_6\}$). Although, an example of n=6 is utilized throughout this description for illustrative purposes, it should be noted that any number n parameters may be utilized.

At step 110, a corresponding slack cutoff ($c_i$) is determined for each parameter ($P_i$). For n parameters an n number of slack cutoff values would be determined (e.g., a set of slack cutoffs $\{c_1, c_2, \ldots c_n\}$ for use in a variable slack cutoff scheme). For example, with n=6 parameters six slack cutoff values may be determined $\{c_1, c_2, c_3, c_4, c_5, c_6\}$. Each slack cutoff ($c_i$) is determined by estimating an upper bound on a slack change of any path in an integrated circuit design that moves from a starting corner to any other corner in a given process sub-space. Each slack cutoff ($c_i$) may be determined empirically utilizing knowledge of a particular integrated circuit technology (e.g., known characteristics of the particular integrated circuit technology, known process variations, known environmental variations, and any combinations thereof). Those of ordinary skill will recognize a variety of processes for estimating an appropriate value for a slack cutoff for a particular implementation. A scheme of variable slack cutoff values (e.g., a scheme including a different slack cutoff value $c_i$ for each parameter $P_i$) may be determined for use in multiple multi-corner analyses by determining the scheme for a particular integrated circuit technology.

In one example, a process sub-space for determining a slack cutoff ($c_i$) may be defined as $P_{i\to n}$, such that the process sub-space includes all parameters from the full process space that are from the ith parameter to the nth parameter. For the example discussed above where n=6, a slack cutoff ($c_i$) may be determined corresponding to each of the parameters $\{P_1, P_2, P_3, P_4, P_5, P_6\}$. In this example, for $P_1$ a corresponding slack cutoff ($c_1$) may be determined by estimating an upper bound on a slack change of any path that moves from a starting corner to any other corner in the process sub-space including parameters $P_1$ to $P_6$ $\{P_1, P_2, P_3, P_4, P_5, P_6\}$. For $P_2$ a corresponding slack cutoff ($c_2$) may be determined by estimating an upper bound on a slack change of any path that moves from a starting corner to any other corner in the process sub-space including parameters $P_2$ to $P_6$ $\{P_2, P_3, P_4, P_5, P_6\}$. For $P_3$ a corresponding slack cutoff ($c_3$) may be determined by estimating an upper bound on a slack change of any path that moves from a starting corner to any other corner in the process sub-space including parameters $P_3$ to $P_6$ $\{P_3, P_4, P_5, P_6\}$. For $P_4$ a corresponding slack cutoff ($c_4$) may be determined by estimating an upper bound on a slack change of any path that moves from a starting corner to any other corner in the process sub-space including parameters $P_4$ to $P_6$ $\{P_4, P_5, P_6\}$. For $P_5$ a corresponding slack cutoff ($c_5$) may be determined by estimating an upper bound on a slack change of any path that moves from a starting corner to any other corner in the process sub-space including parameters $P_1$ to $P_6$ $\{P_5, P_6\}$. For $P_6$ a corresponding slack cutoff ($c_6$) may be determined by estimating an upper bound on a slack change of any path that moves from a starting corner to any other corner in the process sub-space including parameters $P_6$ to $P_6$ $\{P_6\}$.

Figure 2:
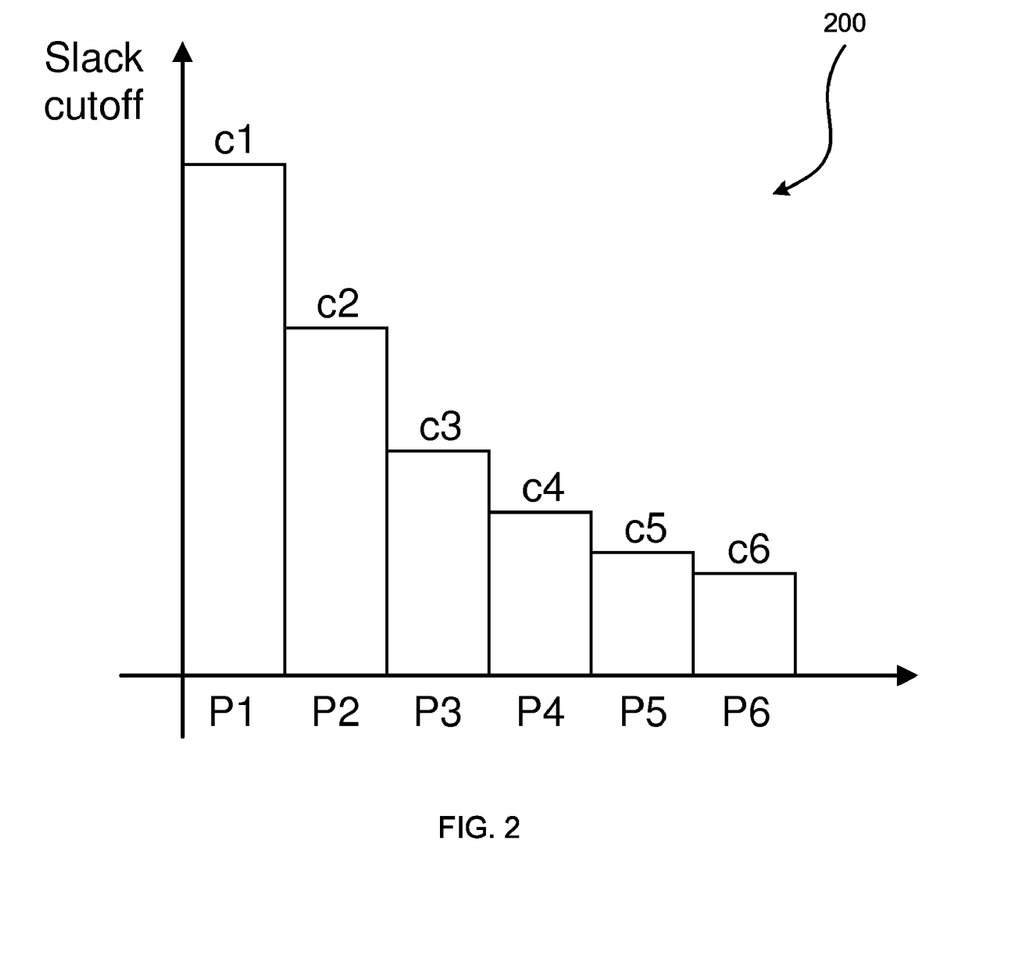
FIG. 2 illustrates a graphical depiction of one example of variable slack cutoffs.

FIG. 2 illustrates a graphical depiction plotting one example of a variable slack cutoff scheme 200 for an exemplary full process space having n=6. In this example, the parameters $\{P_1, P_2, P_3, P_4, P_5, P_6\}$ are represented on the x-axis of the plot. For each parameter $P_i$, a corresponding slack cutoff $c_i$ is shown with increasing slack value on the y-axis. Each slack cutoff ($c_i$) may be determined as discussed above with respect to FIG. 1. In this example, parameters $P_1$ to $P_6$ are shown organized in a parameter order such that the corresponding slack cutoff values $c_1$ to $c_6$ are in descending order. In other examples, alternate parameter ordering may be utilized. One exemplary aspect of a variable slack cutoff scheme (e.g., scheme 200) may be increased efficiency and reduced analysis time when parameters are organized in a parameter order such that corresponding slack cutoff values are in a descending order. In one example, parameters may be organized in a parameter order $P_1$ to $P_n$ such that corresponding impact on variability of timing for each parameter $P_i$ are in a descending order (e.g., parameter $P_1$ having the highest impact on variability of timing and $P_n$ having the lowest impact on variability of timing). Examples of impact on variability of timing include, but are not limited to, a path slack variability, a path latency variability, a path delay variability, a path slew variability, and any combinations thereof. Those of ordinary skill may recognize a variety of ways to determine a delay sensitivity, a path delay variability, a path slack variability, a path slew variability, and/or a path latency variability for a particular parameter. Further embodiments involving the ordering of one or more parameters in a parameter order are discussed below with respect to FIG. 4.

Referring again to FIG. 1, at step 115, a multi-corner timing analysis is performed on one or more paths of an integrated circuit design utilizing the variable slack cutoff scheme determined in step 110. Each slack cutoff ($c_i$) may be used when analyzing a path with respect to a one or more parameters ($P_i$). For example, as a worst slack value is determined for a path as analysis moves off of a starting corner to one or more corner parameter values of a particular parameter ($P_i$), the corresponding slack cutoff ($c_{i+1}$) is used in testing the worst slack value to determine potential timing failure for the path. It should be noted that in such an example after parameter $P_{n-1}$ is varied and the resultant worst slack compared with $c_n$, a further step of varying $P_n$ may occur to determine an additional worst slack that may be compared with a user-defined slack threshold (e.g., a signoff slack, as is known to those of ordinary skill) to determine a timing verification for a path remaining in the analysis. One embodiment of a use of a variable slack cutoff scheme, such as the scheme determined in step 110 is further discussed below with respect to the example set forth in FIG. 3.

At step 120, timing verification information determined by multi-corner analysis of one or more paths at step 115 is output. Output of timing verification information may be in one or more of a variety of forms. Examples of an output include, but are not limited to, representation of an indicator of timing verification information as a displayable image (e.g., via a display device), representation of an indicator of timing verification information as a physical printout (e.g., via a printer of a computing device), transfer of a data element including an indicator of timing verification information (e.g., via an electrical connection, wired or wireless) to a device (e.g., a storage device, a remote computing device), evaluation of pulse width versus the rise/fall times of a signal, and any combinations thereof. In one example, multi-corner analysis of step 115 may be implemented using a computing device. Discussion of one example of a computing environment for implementation of one or more aspects of method 100 is provided below with respect to FIG. 6. A multi-corner timing analysis, such as that performed in step 115, may utilize one or more timing analysis tools. Those of ordinary skill will recognize from the description herein how to configure a timing analysis tool to utilize a variable slack cutoff scheme and perform a multi-corner timing analysis as described herein. Examples of a timing analysis tool include, but are not limited to, EINSTIMER available from International Business Machines, and PRIMETIME available from Synopsys. In another example, output from a computing device performing multi-corner timing analysis may be via generation of data representing a displayable image that includes an indication of timing verification of one or more paths analyzed. The displayable image may be displayed via a display device. Examples of a display device include, but are not limited to, a liquid crystal display (LCD), a cathode ray tube (CRT), a plasma display, and any combinations thereof.

Figure 3:
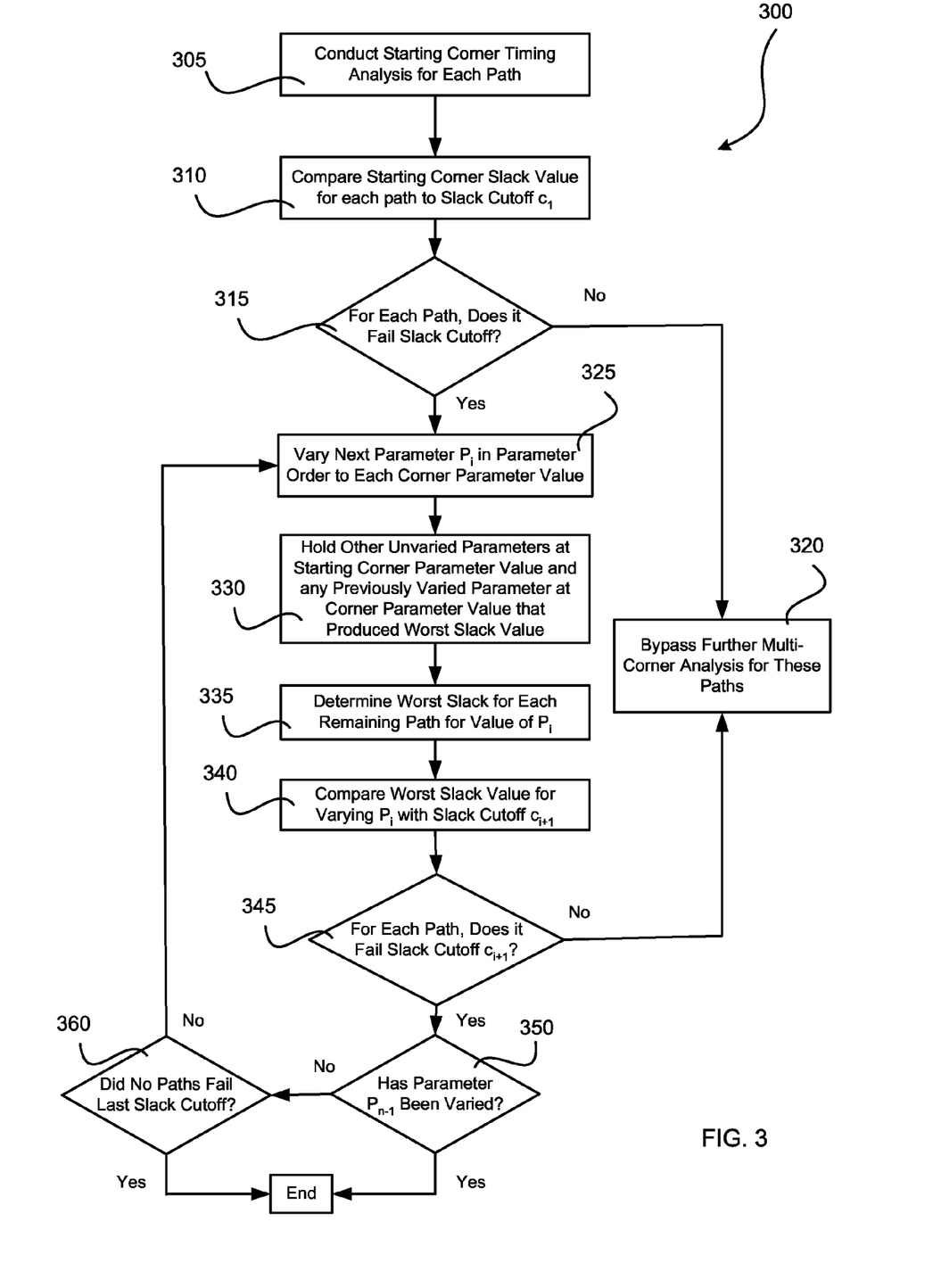
FIG. 3 illustrates another embodiment of a method for reducing processing time in multi-corner static timing analysis.

FIG. 3 illustrates one embodiment of a timing analysis 300. In one example, timing analysis may be performed as part of a multi-corner timing analysis (e.g., multi-corner timing analysis of step 115 of FIG. 1) and may utilize, as set forth below, a variable slack cutoff scheme (e.g., variable slack cutoff scheme as determined by step 110 of FIG. 1, variable slack cutoff scheme 200 of FIG. 2).

At step 305, a starting corner timing analysis is performed to determine a starting corner slack value for each of one or more paths in an integrated circuit design. A starting corner may be any corner and is usually chosen to result in somewhat pessimistic slack values. In one example, a starting corner may be a corner that will give a slowest path delay in a worst case (WC) timing test. In another example, a starting corner may be a corner that will give a fastest path delay in a best case (BC) timing test. A timing analysis may include one or more levels of testing of the starting corner on the paths of the integrated circuit. Starting corner timing analysis may be performed on any number of paths of an integrated circuit design. In one example, starting corner timing analysis is performed on a single path of an integrated circuit design. In another example, starting corner timing analysis is performed on a subset of all of the paths of an integrated circuit design. In yet another example, starting corner timing analysis is performed on all paths of an integrated circuit design.

At step 310, each starting corner slack value is compared to an initial slack cutoff to determine if the corresponding path has a starting corner slack value that fails the slack cutoff. In one example, the initial slack cutoff is any slack cutoff estimating an upper bound on the slack change of any path going from the starting corner to any other corner of a full process space of parameters to be analyzed. In another example, the initial slack cutoff is a slack cutoff ($c_1$) of a variable slack cutoff scheme (e.g., variable slack cutoff scheme 200).

At step 315, any path that passes the initial slack cutoff is passed to step 320. At step 320, further multi-corner analysis for paths that pass the initial slack cutoff may be bypassed. In one example, paths that are bypassed for further analysis at step 320 are paths that are likely to pass timing verification for all corners of the full process space. Any path that fails the initial slack cutoff (e.g., slack cutoff $c_1$) is passed to step 325 for further analysis. Passing or failing a cutoff may depend on the precision of the determination of the cutoff upper bound (e.g., if the upper bound itself includes slack values that should pass, analysis will be to those slack values that are greater than or equal to the slack cutoff; if the upper bound itself includes slack values that should not pass, analysis will be to those slack values that are greater than the slack cutoff). In one example, a path having a slack value that is greater than or equal to a slack cutoff may pass the cutoff (e.g., a path that is determined to be likely to pass all corners of a timing test may require no further analysis). In such an example, a path having a slack value that is less than a slack cutoff will fail the cutoff. In another example, a path having a slack value that is greater than a slack cutoff may pass the cutoff. In such an example, a path having a slack value that is less than or equal to a slack cutoff will fail the cutoff.

Steps 325 through 360, as described below, may iterate depending on the number of parameters ($P_i$) utilized in a particular analysis. At step 325, one or more remaining paths of the paths that failed the most recent slack cutoff comparison (e.g., for a first iteration of step 325 those paths that failed comparison of the starting corner slack with the initial slack cutoff) are further analyzed. This further analysis includes varying the next parameter $P_i$ in the parameter order of PI to $P_n$ to obtain a slack value for each of its corner parameter values (e.g., one of the non-starting corner parameter 3-SIGMA extreme values). For a first iteration of step 325, the next parameter $P_i$ will be $P_1$. For subsequent iterations of step 325, the next parameter is the parameter $P_i$ that occurs next in the parameter order. During this analysis, at step 330, parameters that have not yet been varied are held at their starting corner parameter values and parameters that have been previously varied are held at the corner parameter value that caused the worst slack value for a path, as described below with respect to step 335. In one example, a parameter $P_i$ may have two corner parameter values (e.g., a minimum extreme and a maximum extreme) of which one is the starting corner parameter value. In such an example, parameter $P_i$ is moved off of its starting corner parameter value to its other corner parameter value and a slack is determined. The one or more paths that are analyzed starting at each iteration of step 325 may be all of the paths that failed the previous slack cutoff comparison of a subset of those paths that failed the previous slack cutoff comparison. Those of ordinary skill will recognize a variety of processes for selecting a subset of paths for testing. In one example, a plurality of paths of an integrated circuit design may lead to the same timing test point of the design (e.g., a plurality of paths leading to a single logical latch). In such an example, one or more of this plurality of paths may be tested for timing failure as representative of all of the paths leading to that timing test point (e.g., a path that is known to be likely to have the highest potential delay variation of the plurality of paths leading to a timing test point). The worst slack of this one or more selected paths may be used as representative of all of the paths leading to the timing test point. In another example, any path that has a worst slack value that is below a user-defined threshold (e.g., below zero) analysis on that path may be bypassed as the path is determined via the user-defined threshold to likely have a timing violation.

At step 335, a worst slack value for $P_i$ is determined for each of the one or more remaining paths. A worst slack value is determined by finding the worst slack of the slacks produced at each corner parameter value for $P_i$.

At step 340, for each of the remaining paths, the worst slack value for the varying of $P_i$ is compared with the slack cutoff $c_{i+1}$ of a variable slack cutoff scheme (e.g., a variable slack cutoff scheme as discussed above with respect to FIGS. 1 and 2). In one example, during a first iteration of step 340, $P_1$ was varied at step 325. In such an example, the worst slack for each path for the varying of $P_1$ to each of its corners is compared with slack cutoff $c_2$. In another example, where $P_3$ was varied at step 325, the worst slack for each path for the varying of $P_3$ to each of its corner parameter values is compared with slack cutoff $c_4$.

At step 345, each path that passes slack cutoff $c_{i+1}$ may be bypassed for further analysis at step 320. Each path that fails slack cutoff $c_{i+1}$ is further analyzed through steps 350 and 360 as described below. At step 350, it is determined if during the latest iteration of steps 325 to 345 the parameter $P_{n-1}$ was varied. If parameter $P_{n-1}$ was the most recent varied parameter, the iteration ends. Any remaining paths may be further analyzed with respect to varying of Pn to determine an additional worst slack value for each remaining path. Each additional worst slack value may be compared with a user-defined slack threshold (e.g., a signoff slack) to determine a timing verification for each additionally analyzed path. If parameter $P_{n-1}$ has not yet been varied, step 360 is implemented. At step 360, it is determined if all paths passed the last slack cutoff comparison. If all paths passed the last slack cutoff comparison, there are no remaining paths to be further analyzed and method 300 ends. If paths remain that failed the last slack cutoff comparison, step 325 is reiterated for the next parameter $P_i$ in the parameter order.

Referring again to steps 325 to 360 with respect to an example where number of parameters n=6, the following discussion will illustrate one example of implementation of steps 325 to 360 on a particular path. In this example, during the first iteration of step 325 to 360, parameter $P_1$ is varied from its starting corner parameter value to each of its other corner parameter values while holding $P_2$ to $P_6$ at their respective starting corner parameter values. A worst slack for the path is determined for $P_1$ and compared to slack cutoff $c_2$. If the worst slack passes slack cutoff $c_2$, the analysis of the path ends. If the worst slack fails cutoff $c_2$, the analysis continues.

Since $P_1$ is not $P_{n-1}$ (which in this example is $P_5$) and for illustrative purposes we will describe a path that fails the latest slack cutoff comparison, iteration of steps 325 to 360 continue. During the next iteration, parameter $P_2$ is varied from its starting corner parameter value, parameter $P_1$ is held at its corner parameter value that generated the worst slack, and parameters $P_3$ to $P_6$ are held at their starting corner parameter values. A worst slack for the path is determined for $P_2$ and compared to slack cutoff $c_3$. If the worst slack passes slack cutoff $c_3$, the analysis of the path ends. If the worst slack fails cutoff $c_3$, the analysis continues. During the next iteration, parameter $P_3$ is varied from its starting corner parameter value, parameters $P_1$ to $P_2$ are held at their corner that generated the worst slack, and parameters $P_4$ to $P_6$ are held at their starting corner values. A worst slack for the path is determined for $P_3$ and compared to slack cutoff $c_4$. If the worst slack passes slack cutoff $c_4$, the analysis of the path ends. If the worst slack fails cutoff $c_4$, the analysis continues. During the next iteration, parameter $P_4$ is varied from its starting corner parameter value, parameters $P_1$ to $P_3$ are held at their corner parameter value that generated the worst slack, and parameters $P_5$ to $P_6$ are held at their starting corner parameter values. A worst slack for the path is determined for $P_4$ and compared to slack cutoff $c_5$. If the worst slack passes slack cutoff $c_5$, the analysis of the path ends. If the worst slack fails cutoff $c_5$, the analysis continues. During the next iteration, parameter $P_5$ is varied from its starting corner parameter value, parameters $P_1$ to $P_4$ are held at their corner parameter value that generated the worst slack, and parameter $P_6$ is held at its starting corner parameter value. A worst slack for the path is determined for $P_5$ and compared to slack cutoff $c_6$. If the worst slack passes slack cutoff $c_6$, the analysis of the path ends at step 350 with the timing verification for the path passing. If the worst slack fails cutoff $c_6$, the iteration ends. Such paths that fail cutoff $c_6$ may be further analyzed by varying parameter $P_6$ while holding parameters $P_1$ to $P_5$ at the corner parameter values that generated the worst slack. The worst slack in varying $P_6$ may be compared to a user-defined threshold to determine a timing verification for each path.

Figure 4:
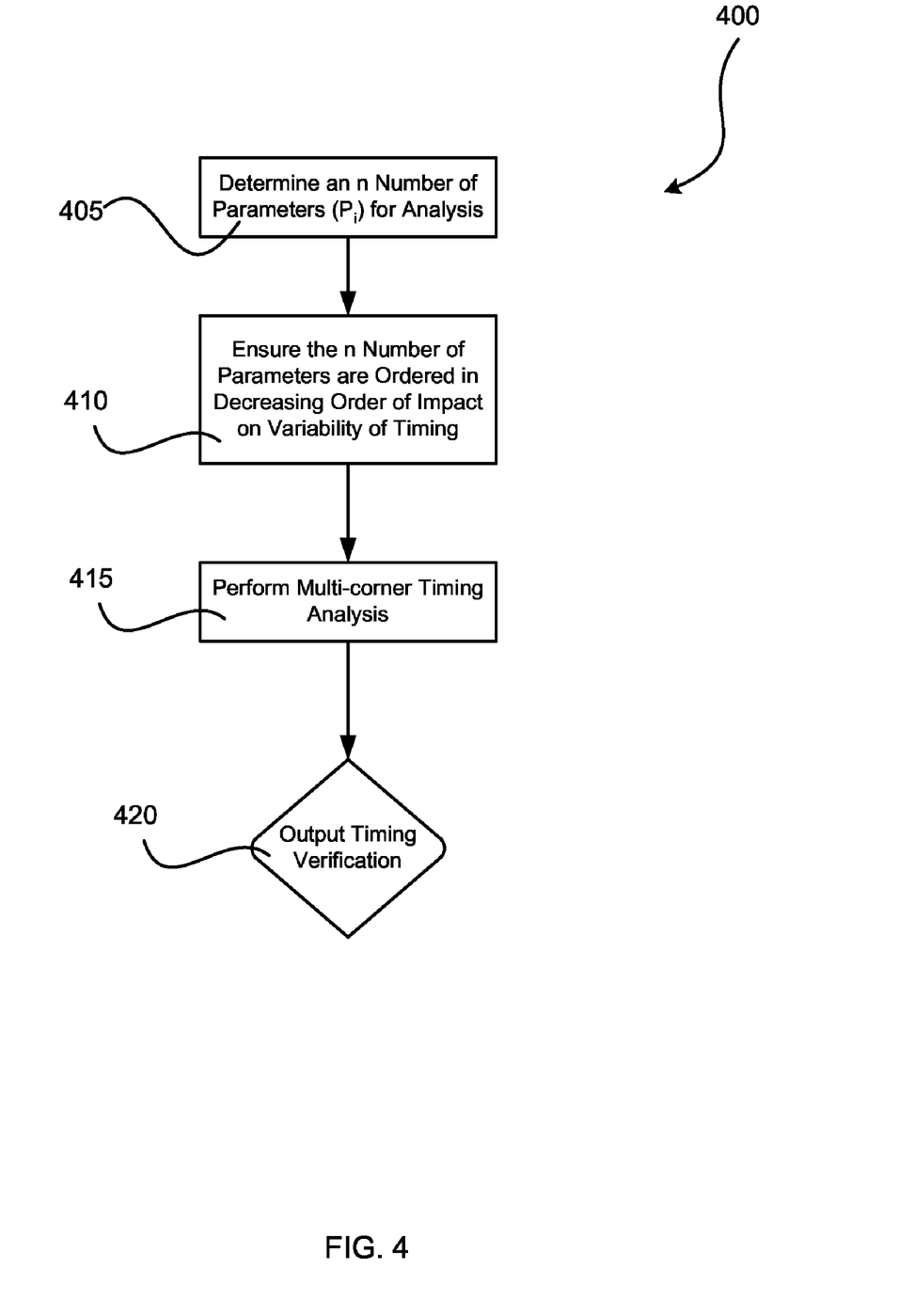
FIG. 4 illustrates yet another embodiment of a method for reducing processing time in multi-corner static timing analysis.

FIG. 4 illustrates yet another embodiment of a method 400. At step 405 of method 400, an n number of dependent parameters ($P_i$) are determined. Each of the dependent parameters $P_i$ has a determinable impact on variability of timing. A dependent parameter is a parameter that has an impact on variability of timing that depends on another parameter in a process space (e.g., a process space $\{P_1, P_2, \ldots P_n\}$). An independent parameter is a parameter that has an impact on variability of timing that can be analyzed in a timing analysis irrespective of other parameter values. Timing analysis utilizing the corner parameter values of independent parameters may be executed one parameter at a time without attention to parameter combinations (reducing the impact on runtime due to the $2^n$ combination problem). In one exemplary aspect of method 400, a parameter order for dependent parameters (e.g., the parameter order discussed below with respect to step 410) may be determined that allows a pseudo-independent treatment to occur during multi-corner timing analysis. An example of such a treatment is set forth below with respect to FIG. 5.

At step 410 of method 400, the parameter order for the n number of parameters ($P_i$) is set such that the parameters $P_1$ to $P_n$ are arranged in a decreasing order of impact on variability of timing (e.g., with $P_1$ having the largest impact on variability of timing and $P_n$ having the smallest impact on variability of timing). At step 415, the decreasing parameter order established in step 410 is utilized in performing a multi-corner timing analysis on one or more paths of an integrated circuit.

Those of ordinary skill will recognize from the present disclosure a variety of ways to utilize such a decreasing parameter order in a multi-corner timing analysis to determine one or more timing verifications for one or more paths of an integrated circuit. In one example, a decreasing parameter order (e.g., the decreasing parameter order of step 410) may be utilized in developing a variable slack cutoff scheme as discussed above. In another example, a decreasing parameter order (e.g., the decreasing parameter order of step 410 may be utilized in a multi-corner timing analysis that treats dependent parameters in an independent fashion such that parameter combinations may be disregarded for a given path analysis (e.g., method 500 of FIG. 5).

In an alternative embodiment, a parameter order may include n number of dependent parameters $P_i$ from $P_1$ to $P_n$ and one or more independent parameters. In such an embodiment, the n number of dependent parameters $P_i$ may be arranged in descending order of impact on variability of timing as described above with respect to step 410. The one or more independent parameters may be added to the parameter order after the last dependent parameter $P_n$. In another alternative embodiment, one or more of the dependent parameters $P_i$ that are arranged in the decreasing parameter order as described above with respect to step 410 may be repeated in the parameter order after the last dependent parameter $P_n$.

Figure 5:
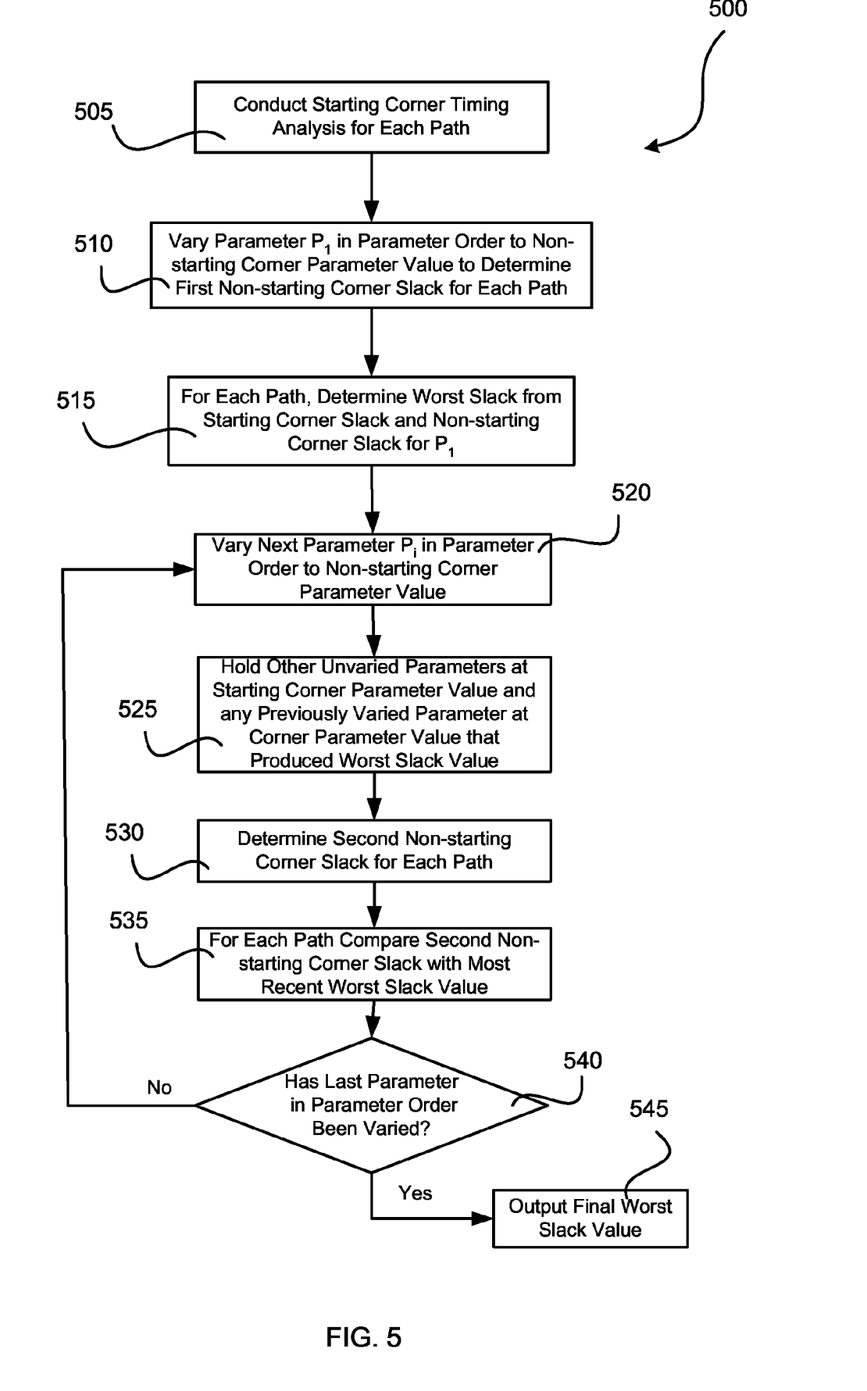
FIG. 5 illustrates an exemplary computing environment in which a system and/or method for reducing processing time in multi-corner static timing analysis may be employed.

FIG. 5 illustrates one embodiment of a multi-corner timing analysis 500 that may utilize a decreasing parameter order as described with respect to FIG. 4. Analysis 500 includes at step 505, conducting a starting corner timing analysis to determine a starting corner slack value for each path of one or more predetermined paths of an integrated circuit design. For example, each dependent parameter $P_i$ in a parameter order may be set to a starting parameter value (e.g., the starting corner). The parameter order in this embodiment is such that the parameters are ordered in decreasing order of impact on variability of timing. As discussed above, an optional example may include one or more independent parameters and/or a repeat of one or more of dependent parameters $P_1$ to $P_n$ arranged in the parameter order after the last parameter $P_n$ in the decreasing variability portion of the parameter order. At step 510, parameter $P_1$ is varied to a non-starting corner to determine a non-starting corner slack value for each path that is to be analyzed. The non-starting corner slack value for each path is compared to the corresponding starting corner slack value to determine a worst slack value for each path. Steps 520 to 540 of method 500 may iterate as described below depending on the number of parameters ($P_i$) utilized in a particular analysis.

At step 520, the next parameter $P_i$ in the parameter order (e.g., starting with parameter $P_2$ for the first iteration of step 520) is varied to a non-starting corner parameter value. At step 525, parameters that have not yet been varied are held at their starting corner parameter values and parameters that have been previously varied are held at the corner parameter value that caused the worst slack value for a path, as described below with respect to step 535. At step 530, a non-starting corner slack is determined for the varying of the parameter $P_i$ in step 520. At step 535, this non-starting corner slack is compared to the worst slack value determined from the most recent prior comparison. For example, when $P_2$ is varied at step 520 to determine a non-starting corner slack at step 530, this non-starting corner slack is compared with the worst slack value determined at step 515 for the varying of $P_1$ to update a new value for the worst slack for each path. In another example, where $P_3$ is varied at step 520 to determine a non-starting corner slack value at step 530, this non-starting corner slack value is compared with the worst slack value determined at the previous iteration of step 535 to update a new value for the worst slack for each path.

At step 540, it is determined if the last parameter in the parameter order has been varied. If the last parameter has not been varied during the last iteration of step 520, step 520 is iterated again for the next parameter $P_i$ in the parameter order. If the last parameter has been varied during the last iteration of step 520, the most recently updated value for the worst slack for each path is output at step 545 as a final worst slack value. Various types of outputs are discussed above. Each final worst slack value may be utilized to determine a timing verification for a corresponding path. In one example, a final worst slack value may be compared with a user-defined threshold (e.g., a signoff slack value) to determine an indication of timing verification.

Referring again to steps 510 to 540 with respect to an example where the number of dependent parameters n=6, the following discussion will illustrate one example of implementation of steps 510 to 540 on a particular path. At step 510, parameter $P_1$ is varied to its non-starting corner parameter value and a non-starting corner slack is determined for each path. At step 515, the non-starting corner slack is compared to the starting corner slack to determine a worst slack value for the varying of parameter $P_1$. At the first iteration of step 520, parameter $P_2$ is varied to a non-starting corner parameter value while holding parameter $P_1$ at its corner parameter value that produced the worst slack value determined at step 515 and holding parameters $P_3$ to $P_6$ at their starting corner parameter values. At step 530, a non-starting corner slack is determined for each path for the varying of parameter $P_2$. At step 535, this non-starting corner slack is compared to the worst slack value for the varying of parameter $P_1$. A new worst slack value is determined from these two values. Step 520 iterates for parameter $P_3$. At this iteration of step 520, parameter $P_3$ is varied to a non-starting corner parameter value while holding parameters $P_1$ and $P_2$ at their respective corner parameter values that produced the worst slack value determined at the prior iterations and holding parameters $P_4$ to $P_6$ at their starting corner parameter values. At step 530, a non-starting corner slack is determined for each path for the varying of parameter $P_3$. At step 535, this non-starting corner slack is compared to the worst slack value for the varying of parameter $P_2$. A new worst slack value is determined from these two values. Step 520 iterates for parameter $P_4$. At this iteration of step 520, parameter $P_4$ is varied to a non-starting corner parameter values while holding parameters $P_1$ to $P_3$ at their respective corner parameter values that produced the worst slack value determined at the prior iterations and holding parameters $P_5$ to $P_6$ at their starting corner parameter values. At step 530, a non-starting corner slack is determined for each path for the varying of parameter $P_4$. At step 535, this non-starting corner slack is compared to the worst slack value for the varying of parameter $P_3$. A new worst slack value is determined from these two values. Step 520 iterates for parameter $P_5$. At this iteration of step 520, parameter $P_5$ is varied to a non-starting corner parameter value while holding parameters $P_1$ to $P_4$ at their respective corner parameter values that produced the worst slack value determined at the prior iterations and holding parameter $P_6$ at its starting corner parameter value. At step 530, a non-starting corner slack is determined for each path for the varying of parameter $P_5$. At step 535, this non-starting corner slack is compared to the worst slack value for the varying of parameter $P_4$. A new worst slack value is determined from these two values. Step 520 iterates for parameter $P_6$. At this iteration of step 520, parameter $P_6$ is varied to a non-starting corner parameter value while holding parameters $P_1$ to $P_5$ at their respective corner parameter values that produced the worst slack value determined at the prior iterations. At step 530, a non-starting corner slack is determined for each path for the varying of parameter $P_6$. At step 535, this non-starting corner slack is compared to the worst slack value for the varying of parameter $P_5$. A new worst slack value is determined from these two values. This worst slack value is output at step 545 as a final worst slack value.

It is to be noted that the aspects and embodiments described herein may be conveniently implemented using one or more machines (e.g., a general purpose computing device) programmed according to the teachings of the present specification, as will be apparent to those of ordinary skill in the computer art. For example, various aspects of a method of reducing processing time in multi-corner static timing analysis, such as methods 100, 300, 400, 500 may be implemented as machine-executable instructions (i.e., software coding), such as program modules executed by one or more machines. Typically a program module may include routines, programs, objects, components, data structures, etc. that perform specific tasks. Appropriate machine-executable instructions can readily be prepared by skilled programmers based on the teachings of the present disclosure, as will be apparent to those of ordinary skill in the software art.

Such software may be a computer program product that employs a machine-readable medium. A machine-readable medium may be any medium that is capable of storing and/or encoding a sequence of instructions for execution by a machine (e.g., a general purpose computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

Examples of a general purpose computing device include, but are not limited to, a computer workstation, a terminal computer, a server computer, a handheld device (e.g., tablet computer, a personal digital assistant "PDA", a mobile telephone, etc.), a web appliance, a network router, a network switch, a network bridge, any machine capable of executing a sequence of instructions that specify an action to be taken by that machine, and any combinations thereof. In one example, a general purpose computing device may include and/or be included in, a kiosk.

Figure 6:
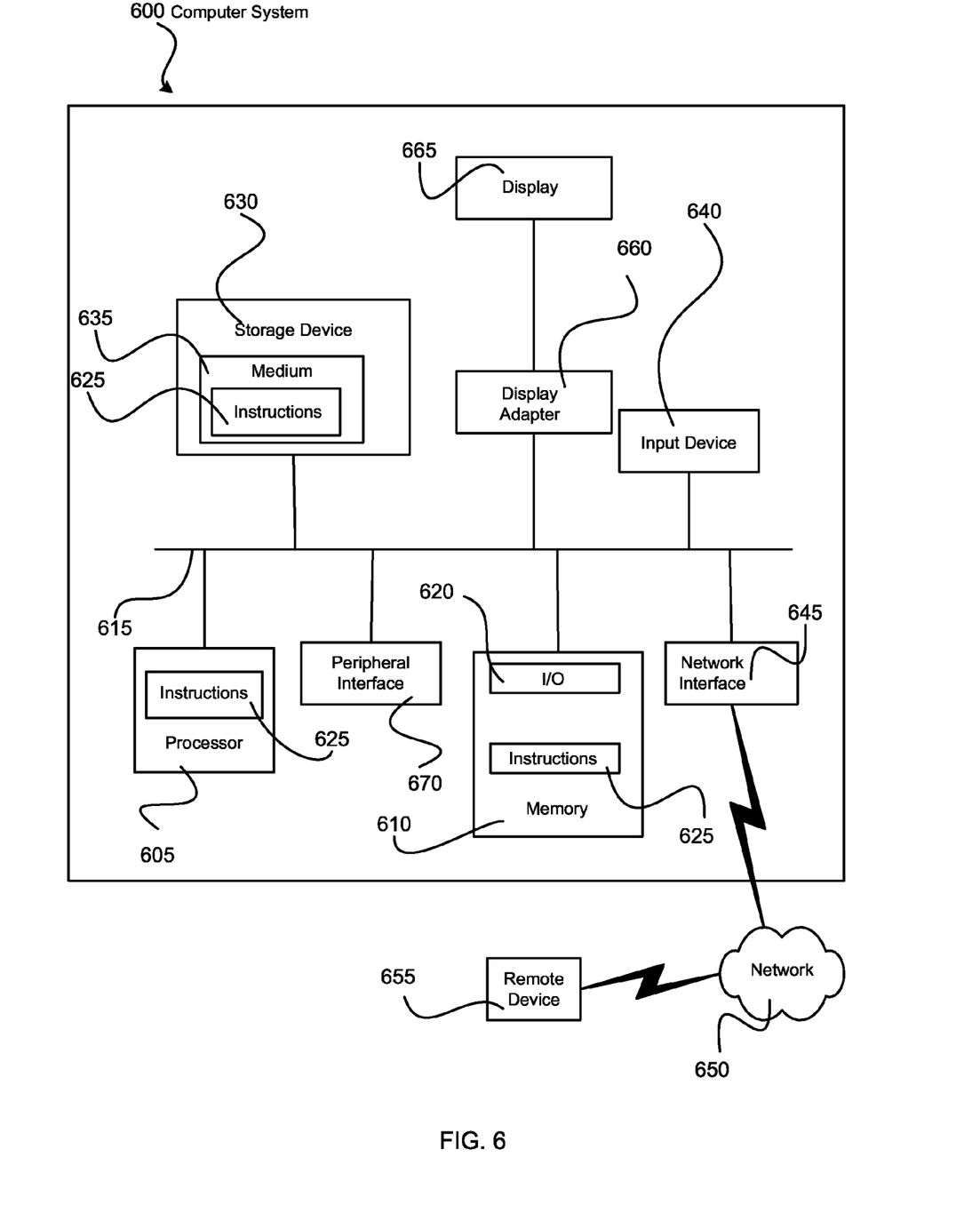
FIG. 6 illustrates a diagrammatic representation of one embodiment of a computing device.

FIG. 6 shows a diagrammatic representation of one embodiment of a general purpose computing device in the exemplary form of a computer system 600 within which a set of instructions for causing the device to perform any one or more of the aspects and/or methodologies of the present disclosure may be executed. Computer system 600 includes a processor 605 and a memory 610 that communicate with each other, and with other components, via a bus 615. Bus 615 may include any of several types of bus structures including, but not limited to, a memory bus, a memory controller, a peripheral bus, a local bus, and any combinations thereof, using any of a variety of bus architectures.

Memory 610 may include various components (e.g., machine readable media) including, but not limited to, a random access memory component (e.g, a static RAM "SRAM", a dynamic RAM "DRAM", etc.), a read only component, and any combinations thereof. In one example, a basic input/output system 620 (BIOS), including basic routines that help to transfer information between elements within computer system 600, such as during start-up, may be stored in memory 610. Memory 610 may also include (e.g., stored on one or more machine-readable media) instructions (e.g., software) 625 embodying any one or more of the aspects and/or methodologies of the present disclosure. In another example, memory 610 may further include any number of program modules including, but not limited to, an operating system, one or more application programs, other program modules, program data, and any combinations thereof.

Computer system 600 may also include a storage device 630. Examples of a storage device (e.g, storage device 630) include, but are not limited to, a hard disk drive for reading from and/or writing to a hard disk, a magnetic disk drive for reading from and/or writing to a removable magnetic disk, an optical disk drive for reading from and/or writing to an optical media (e.g., a CD, a DVD, etc.), a solid-state memory device, and any combinations thereof. Storage device 630 may be connected to bus 615 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 630 may be removably interfaced with computer system 600 (e.g., via an external port connector (not shown)). Particularly, storage device 630 and an associated machine-readable medium 635 may provide nonvolatile and/or volatile storage of machine-readable instructions, data structures, program modules, and/or other data for computer system 600. In one example, software 625 may reside, completely or partially, within machine-readable medium 635. In another example, software 625 may reside, completely or partially, within processor 605.

Computer system 600 may also include an input device 640. In one example, a user of computer system 600 may enter commands and/or other information into computer system 600 via input device 640. Examples of an input device 640 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 640 may be interfaced to bus 615 via any of a variety of interfaces (not shown) including, but not limited to, a serial interface, a parallel interface, a game port, a USB interface, a FIREWIRE interface, a direct interface to bus 615, and any combinations thereof.

A user may also input commands and/or other information to computer system 600 via storage device 630 (e.g., a removable disk drive, a flash drive, etc.) and/or a network interface device 645. A network interface device, such as network interface device 645 may be utilized for connecting computer system 600 to one or more of a variety of networks, such as network 650, and one or more remote devices 655 connected thereto. Examples of a network interface device include, but are not limited to, a network interface card, a modem, and any combination thereof. Examples of a network or network segment include, but are not limited to, a wide area network (e.g., the Internet, an enterprise network), a local area network (e.g., a network associated with an office, a building, a campus or other relatively small geographic space), a telephone network, a direct connection between two computing devices, and any combinations thereof. A network, such as network 650, may employ a wired and/or a wireless mode of communication. In general, any network topology may be used. Information (e.g., data, software 625, etc.) may be communicated to and/or from computer system 600 via network interface device 645.

Computer system 600 may further include a video display adapter 660 for communicating a displayable image to a display device, such as display device 665. Examples of a display device include, but are not limited to, a liquid crystal display (LCD), a cathode ray tube (CRT), a plasma display, and any combinations thereof. In addition to a display device, a computer system 600 may include one or more other peripheral output devices including, but not limited to, an audio speaker, a printer, and any combinations thereof. Such peripheral output devices may be connected to bus 615 via a peripheral interface 670. Examples of a peripheral interface include, but are not limited to, a serial port, a USB connection, a FIREWIRE connection, a parallel connection, and any combinations thereof.

A digitizer (not shown) and an accompanying pen/stylus, if needed, may be included in order to digitally capture freehand input. A pen digitizer may be separately configured or coextensive with a display area of display device 665. Accordingly, a digitizer may be integrated with display device 665, or may exist as a separate device overlaying or otherwise appended to display device 665.

In one exemplary aspect, a method of reducing processing time in multi-corner static timing analysis, such as methods 100, 200, 300, 400, may significantly reduce the runtime of a multi-corner timing analysis.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A computerized method of decreasing processing time in multi-corner static timing analysis, the method comprising:

determining an n number of dependent parameters ($P_i$) for timing analysis, wherein the n number of dependent parameters ($P_i$) define a process space $\{P_1, P_2, \ldots P_n\}$ including an n number of process sub-spaces each including parameters $P_{i \rightarrow n}$;

organizing the n number of dependent parameters ($P_i$) in a decreasing parameter order from a first parameter $P_1$ having a largest variability of timing to a last parameter $P_n$ having a smallest variability on timing;

assigning a corresponding slack cutoff ($c_i$) $\{c_1, c_2, \ldots c_n\}$ for each parameter of the n number of parameters, wherein each corresponding slack cutoff $c_i$ represents an estimated maximum slack change between a starting corner for the process space $\{P_1, P_2, \ldots P_n\}$ a and any other corner in a corresponding process sub-space $\{P_{i \rightarrow n}\}$; and performing, by using a computer, a multi-corner timing analysis by utilizing the decreasing parameter order to output an indication of timing verification for one or more paths of an integrated circuit design, wherein said performing a multi-corner timing analysis includes:

comparing each starting corner slack to slack cutoff $c_1$ to determine any paths having a starting corner slack that fails the slack cutoff $c_1$;

analyzing one or more remaining paths of the paths that fail the previous slack cutoff comparison by varying the next parameter $P_i$ in the parameter order, starting with $P_1$, to each of its corner parameter values while holding any other unvaried parameter at its starting corner parameter value and holding any previously varied parameter at a corner parameter value that produced its corresponding worst slack value, said analyzing including:
  determining a worst slack value for each of the one or more remaining paths;
  comparing each worst slack value corresponding to varying $P_i$ with slack cutoff $c_{i+1}$; and
  determining any paths that have a worst slack value corresponding to varying $P_i$ that fails the slack cutoff $c_{i+1}$; and
repeating said analyzing step for each parameter $P_i$ until no paths fail a slack cutoff comparison and/or said varying of $P_{n-1}$ is performed.

2. A computerized method according to claim 1, wherein said performing a multi-corner timing analysis includes:
  conducting a starting corner timing analysis to determine a starting corner slack for each path of one or more pre-determined paths of the integrated circuit design;
  varying parameter $P_1$ in the parameter order to a non-starting corner parameter value of $P_1$ to determine a first non-starting corner slack for each path;
  comparing the starting corner slack for each path with a corresponding first non-starting corner slack to determine a worst slack value for each path at $P_1$;
  analyzing each path by varying a next parameter $P_i$ in the parameter order, starting with $P_2$, to a non-starting corner parameter value of $P_i$ while holding any other unvaried parameter at its starting corner parameter value and holding any previously varied parameter at a corner parameter value that produced its corresponding worst slack value, said analyzing including:
    determining a second non-starting corner slack for each path; and
    comparing the second non-starting corner slack for each path with a corresponding worst slack value determined from the most recent prior comparing step to update the worst slack value for each path at $P_i$; and
  repeating said analyzing step for each remaining parameter $P_i$ in the parameter order and outputting the worst slack value determined at the varying of the last parameter in the parameter order as a final slack value.

3. A computerized method according to claim 2, further comprising comparing each final slack value for one or more paths to a user-defined threshold to determine a timing verification for each of the one or more paths.

4. A computerized method according to claim 2, further comprising including in the parameter order one or more independent parameters, wherein the one or more independent parameters are organized after the last dependent parameter $P_n$.

5. A computerized method according to claim 1, further comprising repeating in the parameter order one or more of parameters $P_1$ to $P_n$ after parameter in the parameter order.

6. A computerized method according to claim 1, further comprising including in the process space $\{P_1, P_2, \ldots P_n\}$ one or more independent parameters.

7. A computerized method according to claim 1, wherein the impact of variability of timing includes a variability selected from the group consisting of a path slack variability, a path latency variability, a path delay variability, a path slew variability, and any combinations thereof.

8. A computerized method of decreasing processing time in multi-corner static timing analysis, the method comprising:
  determining an n number of dependent parameters ($P_i$) for timing analysis;
  organizing the n number of dependent parameters ($P_i$) in a decreasing parameter order from a first parameter $P_1$ having a largest variability of timing to a last parameter $P_n$ having a smallest variability on timing;
  conducting a starting corner timing analysis to determine a starting corner slack for each path of one or more pre-determined paths of an integrated circuit design;
  varying parameter $P_1$ in the parameter order to a non-starting corner parameter value to determine a first non-starting corner slack for each path;
  comparing the starting corner slack for each path with a corresponding first non-starting corner slack to determine a worst slack value for each path at $P_i$;
  analyzing, by using a computer, each path by varying a next parameter $P_i$ in the parameter order, starting with $P_2$, to a non-starting corner parameter value while holding any other unvaried parameter at its starting corner parameter value and holding any previously varied parameter at a corner parameter value that produced its corresponding worst slack value, said analyzing including:
    determining a second non-starting corner slack for each path; and
    comparing the second non-starting corner slack for each path with a corresponding worst slack value determined from the most recent prior comparing step to update the worst slack value for each path at $P_i$;
  repeating said analyzing step for each remaining parameter $P_i$ in the parameter order and determining a final worst slack value for each path from the worst slack value determined by the varying of the last parameter in the parameter order;
  outputting an indication of timing verification based on the final worst slack for each path of one or more paths of the integrated circuit design.

9. A computerized method according to claim 8, further comprising comparing each final worst slack value for one or more paths to a user-defined threshold to determine a timing verification for each of the one or more paths.

10. A computerized method according to claim 8, further comprising including in the parameter order one or more independent parameters, wherein the one or more independent parameters are organized after the last dependent parameter $P_n$.

11. A computerized method according to claim 8, wherein the impact of variability of timing includes a variability selected from the group consisting of a path slack variability, a path latency variability, a path delay variability, path slew variability, and any combinations thereof.

12. A computer readable medium containing computer executable instructions, the computer executable instructions, when executed by a computer, implementing a method of decreasing processing time in multi-corner static timing analysis, the instructions comprising:
  a set of instructions for determining an n number of dependent parameters ($P_i$) for timing analysis;
  a set of instructions for organizing the n number of dependent parameters ($P_i$) in a decreasing parameter order from a first parameter $P_1$ having a largest variability of timing to a last parameter $P_n$ having a smallest variability on timing; and
  a set of instructions for performing a multi-corner timing analysis by utilizing the decreasing parameter order to output an indication of timing verification for one or more paths of an integrated circuit design, wherein the n number of dependent parameters ($P_i$) define a process space $\{P_1, P_2, \ldots P_n\}$ including an n number of process sub-spaces each including parameters $P_{i \to n}$ and said set of instructions for performing a multi-corner timing analysis includes:
- a set of instructions for assigning a corresponding slack cutoff $(c_i)$ $\{c_1, c_2, \ldots c_n\}$ for each parameter of the n number of parameters, wherein each corresponding slack cutoff $c_i$ represents an estimated maximum slack change between a starting corner for the process space $\{P_1, P_2, \ldots P_n\}$ and any other corner in a corresponding process sub-space $\{P_{i \to n}\}$;
- a set of instructions for comparing each starting corner slack to slack cutoff $c_1$ to determine any paths having a starting corner slack that fails the slack cutoff $c_1$;
- a set of instructions for analyzing one or more remaining paths of the paths that fail the previous slack cutoff comparison by varying the next parameter Pi in the parameter order, starting with $P_1$, to each of its corner parameter values while holding any other unvaried parameter at its starting corner parameter value and holding any previously varied parameter at a corner parameter value that produced its corresponding worst slack value, said set of instructions for analyzing including:
  - a set of instructions for determining a worst slack value for each of the one or more remaining paths;
  - a set of instructions for comparing each worst slack value corresponding to varying $P_i$ with slack cutoff $c_{i+1}$; and
  - a set of instructions for determining any paths that have a worst slack value corresponding to varying $P_i$ that fails the slack cutoff $c_{i+1}$; and
- a set of instructions for repeating said analyzing step for each parameter $P_i$ until no paths fail a slack cutoff comparison and/or said varying of $P_{n-1}$ is performed.

13. A computer readable medium according to claim 12, wherein said performing a multi-corner timing analysis includes:
- a set of instructions for conducting a starting corner timing analysis to determine a starting corner slack for each path of one or more predetermined paths of the integrated circuit design;
- a set of instructions for varying parameter $P_1$ in the parameter order to a non-starting corner parameter value to determine a first non-starting corner slack for each path;
- a set of instructions for comparing the starting corner slack for each path with a corresponding first non-starting corner slack to determine a worst slack value for each path at $P_1$;
- a set of instructions for analyzing each path by varying the next parameter $P_i$ in the parameter order, starting with $P_2$, to a non-starting corner parameter value while holding any other unvaried parameter at its starting corner parameter value and holding any previously varied parameter at a corner parameter value that produced its corresponding worst slack value, said set of instructions for analyzing including:
  - a set of instructions for determining a second non-starting corner slack for each path; and
  - a set of instructions for comparing the second non-starting corner slack for each path with a corresponding worst slack value determined from the most recent prior comparing step to update the worst slack value for each path at Pi; and
- a set of instructions for repeating said analyzing step for each remaining parameter $P_i$ in the parameter order and outputting the worst slack value determined at the varying of the last parameter in the parameter order as a final slack value.

14. A computer readable medium according to claim 13, further comprising a set of instructions for comparing each final slack value for one or more paths to a user-defined threshold to determine a timing verification for each of the one or more paths.

15. A computer readable medium according to claim 12, further comprising a set of instructions for repeating in the parameter order one or more of parameters $P_1$ to $P_n$ after parameter $P_n$ in the parameter order.

16. A computer readable medium according to claim 12, wherein the impact of variability of timing includes a variability selected from the group consisting of a path slack variability, a path latency variability, a path delay variability, path slew variability, and any combinations thereof.

* * * * *